United States Patent [19]

St. Cyr

[11] Patent Number: 4,502,829
[45] Date of Patent: Mar. 5, 1985

[54] ELECTRONIC COMPONENT SENSING SYSTEM

[75] Inventor: Paul L. St. Cyr, Middleton, Mass.

[73] Assignee: USM Corporation, Farmington, Conn.

[21] Appl. No.: 479,121

[22] Filed: Apr. 1, 1983

[51] Int. Cl.³ .................... B25J 15/02; B23P 19/00
[52] U.S. Cl. .................................. 414/730; 29/703;
29/705; 29/740; 209/539; 209/573; 209/906;
364/478; 414/749; 901/47
[58] Field of Search ............... 209/539, 555, 556, 558,
209/573, 586, 906; 29/593, 702, 703, 705, 739,
740, 741, 759, 831, 832, 834; 364/468, 478, 490;
414/730, 749; 250/223 R

[56] References Cited

U.S. PATENT DOCUMENTS

| | | | |
|---|---|---|---|
| 2,740,521 | 4/1956 | Calvin | 209/586 |
| 2,982,403 | 5/1961 | Harmon | 209/586 |
| 3,564,691 | 2/1971 | Ackerman | 29/759 X |
| 3,581,375 | 6/1971 | Rottman | 29/740 X |
| 3,593,404 | 7/1971 | Ragard | 29/741 X |
| 3,670,153 | 6/1972 | Rempert et al. | 364/468 |
| 3,747,753 | 7/1973 | Flint | 209/555 |
| 3,893,232 | 7/1975 | Fletcher et al. | 29/741 X |
| 3,910,420 | 10/1975 | Rich | 414/749 X |
| 4,222,488 | 9/1980 | Jones et al. | 209/911 X |
| 4,393,579 | 7/1983 | Van Hooreweder | 29/759 X |

Primary Examiner—Robert B. Reeves
Assistant Examiner—Edward M. Wacyra
Attorney, Agent, or Firm—William F. White

[57] ABSTRACT

A system for sensing the size of electronic components processed within a machine for placing components on a media such as a printed circuit board. The size of a component is determined at a sensing station and the component is thereafter precisely positioned according to its size relative to a placement head. The placement head picks up the thus positioned component and places the component on the media.

14 Claims, 8 Drawing Figures

ELECTRONIC COMPONENT SENSING SYSTEM

FIELD OF THE INVENTION

This invention relates to the processing of semi-conductor chips for placement on a printed circuit board at high rates of speed. In particular, this invention relates to the sensing of the size of the processed chips.

BACKGROUND OF THE INVENTION

The processing of chip-size electronic components for placement on a printed circuit board is disclosed in commonly assigned U.S. patent application Ser. No. 299,979, filed Sept. 8, 1981. The disclosed system utilizes an air conveyor to transport chips, one at a time, from their respective input stations to a placement head that places them onto a printed circuit board. The disclosed system furthermore makes reference to sensing the size of the chip and thereafter adjusting the position of the chip relative to the placement head. The disclosed system does not however address how the size of a chip is sensed and differentiated from another chip size. The disclosed system moreover does not specifically address how a particular size of chip is caused to be centered underneath the placement head.

OBJECTS OF THE INVENTION

It is an object of the invention to provide a particular system for sensing the sizes of chips that are to be processed within a machine for placing different sized chips on a printed circuit board.

It is another object of the invention to provide a system which can sense at least two different sizes of chips and thereafter define the centered position of these chips relative to a chip placement head.

SUMMARY OF THE INVENTION

The above and other objects of the present invention are achieved by a chip sensing system which includes a fiber-optic sensor positioned within a track of a machine that processes the chips. The chip first stops within the track at a sensing station and is thereafter positioned against the sensor. The above is done under computer control which thereafter reads the status of the sensor to determine the length of the chip. The length determination allows the computer control to center the chip according to its size at another station. This station is a chip placement station wherein the chip is centered relative to a chip placement head. The placement head subsequently places the chip on a receiving media such as a printed circuit board.

DESCRIPTION OF THE PREFERRED EMBODIMENT

Figure 1:
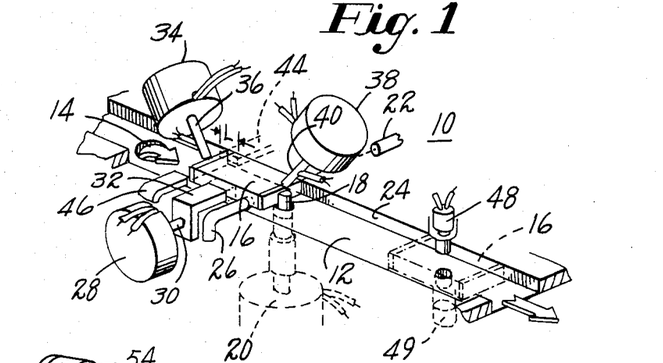
FIG. 1 is an illustration of a chip sensing station.

Referring now to FIG. 1, a chip sensing station 10 is generally illustrated. It is to be understood that the chip sensing station 10 is situated within a machine for processing chips such as is disclosed in commonly assigned U.S. application Ser. No. 299,979 entitled, "Micro Component Assembly Machine", filed on Sept. 8, 1981. Electronic component chips are processed through the aforementioned machine via one or more air tracks such as is denoted by a channel 12 within the chip sensing station 10. The channel 12 has various sources of air such as 14 which move an electronic component chip 16 along the channel 12. The chip 16 is stopped at the chip sensing station 10 by a stop member 18. The stop member 18 is positioned within the channel 12 by an actuator 20. The stop member 18 is preferably spring biased within the actuator 20 so as to assume the illustrated up position within the channel 12. The actuator moves the stop member downwardly against this spring bias when activated.

A fiber optic sensor 22 is embedded within a sidewall 24 of the channel 12. The fiber optic sensor 22 senses the absence of light from a light source 26 when a chip is in place within the chip sensing station. The chip 16 is urged against the sidewall 24 by a position actuator 28. The position actuator 28 is preferably a solenoid actuator which moves the chip 16 into place against the side wall when activated. The position actuator 28 includes an extendable member 30 with a bracket 32 attached thereto. The bracket 32 moves into the channel 12 and urges the chip 16 against the opposite sidewall 24.

The chip 16 is also urged against the stop member 18 by a rear actuator 34. The rear actuator 34 is preferably a solenoid actuator having an extendable member 36 which urges the chip 16 toward the stop member 18 when activated. It is to be noted that the extendable member 36 may be a test probe which electrically contacts the rear of the chip 16. This forms one part of a testing system disclosed in U.S. application Ser. No. 451,917, filed on Dec. 27, 1982. The disclosed testing system includes a front actuator 38 having an extendable probe member 40 which contacts the front portion of the chip 16.

The rear edge of the chip 16 is sensed by a fiber optic sensor 44. The sensor 44 is preferably a bundle of individual fiber optic strands of sufficient length "L" to receive a substantial amount of light from a light source 46 when a small size chip 16 is in the sensing station. In this regard, it is preferable that the rear edge of a small size chip will just reach the front edge of the sensor 44. On the other hand, the sensor 44 is to be substantially covered when a large size chip is in the sensing station 10. This is accomplished by placing the front edge of the sensor 44 at a distance from the stop member 18 equal to the length of the small size chip. The distance "L" is then preferably the difference in length between the small and larger size chip. This will result in the sensor 44 being substantially covered when the large chip is in the sensing station. As will be explained in detail hereinafter, the amount of light detected by the sensor 44 will be analyzed for the purpose of determining the particular size of chip within the channel Following measurement of the size of the chip 16 and a testing of the chip (if the same is so desired), the stop member 18 is removed so as to allow the air source 14 to move the chip 16 down the channel 12. The chip 16 passes underneath a sensor 48 which detects a momentary absence of light from a light source 49. The chip proceeds down the channel 12 to a chip placement station 50. It is to be understood that a chip placement station 50 may be located at a considerable distance from the chip sensing station 10. The only requirement is that the channel 12 be sufficiently pressurized so as to allow for the movement of the chip 16 between the chip sensing station 10 and the chip placement station 50. The chip placement station 50 is seen to include a chip placement head 52 which picks up the chip and places it onto a substrate as is disclosed in U.S. application Ser. No. 299,979, filed on Sept. 8,1981. Before this occurs, the chip is centered with respect to the placement head 52 in accordance with the size of the chip. The structure which allows for this centering of the chip with respect to the placement head 52 will now be described.

Figures 2, 3:
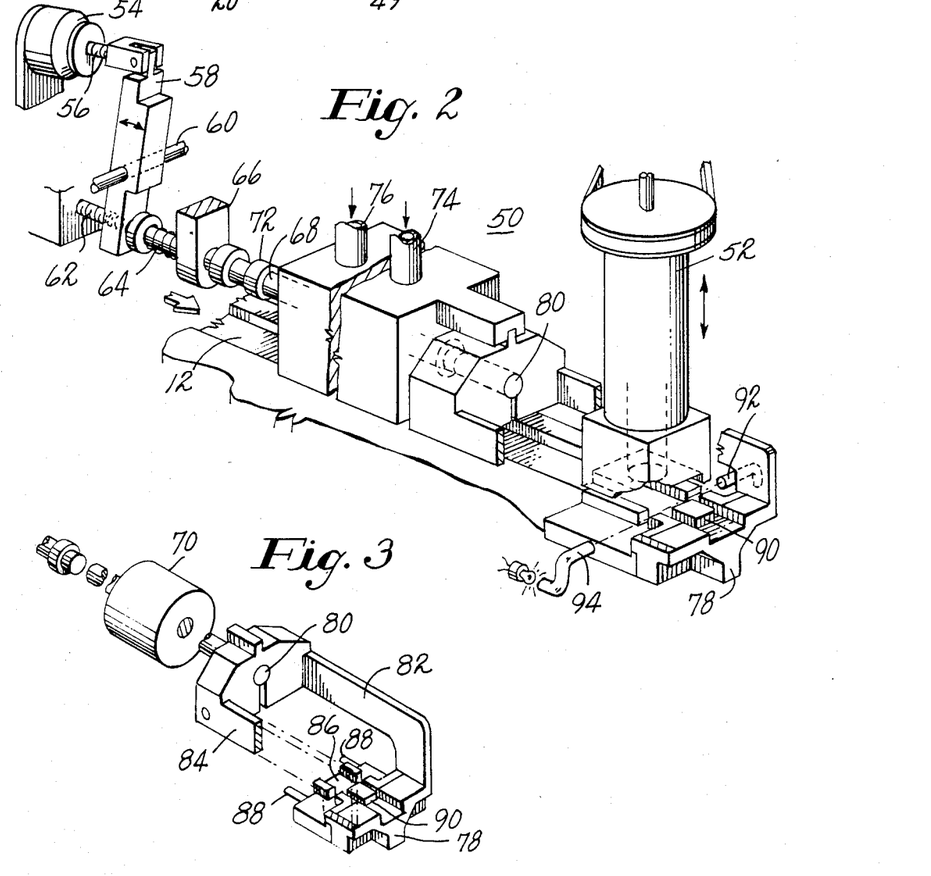
FIG. 2 is an illustration of a chip placement station.
FIG. 3 is an illustration of a portion of the chip placement station of FIG. 2.

Referring to FIG. 2, a solenoid actuator 54 having an extendable member 56 is pivotably attached to a rotatable member 58. The rotatable member 58 rotates about a fixed axis 60. The amount of backward rotation is defined by a threaded stud 62. The rotatable member 58 is biased against the threaded stud 62 by a spring loaded abutment shaft 64. The abutment shaft 64 is spring loaded against a fixed mount 66 which allows the abutment shaft to slide within. One end of the abutment shaft contacts an end of a drive shaft 68 associated with an air cylinder 70. The ends of the shafts 64 and 68 are maintained in alignment by a collar 72 preferably affixed to the drive shaft 68.

The air cylinder 70 is preferably a double acting air cylinder receiving air through a set of ports 74 and 76. The double acting air cylinder 70 moves a shelf 78 attached to the opposite end 80 of the drive shaft 68. Referring to FIG. 3, the shelf 78 is seen to include a pair of side brackets 82 and 84 which hold the shelf 78 at a distance from the end 80 of the shaft 68. The bracket 84 is cut away so as to show the shelf structure which includes a channel portion 86 that normally abuts the channel 12 of FIG. 2 so as to form a continuous channel for the chip. The channel portion 86 is maintained in alignment with respect to channel 12 by a pair of pins such as 88 which slidably engage holes within the structure associated with the channel 12. Channel portion 86 has an elastomeric stop 90 which stops a chip traveling down the channel 12.

The channel portion 86 is normally positioned under the placement head 52 so as to allow the thus stopped chip to be drawn up unto the placement head 52. The shelf portion 86 is subsequently displaced by the double acting air cylinder 70 so as to move out from underneath the placement head 52. This allows the chip held within the placement head 52 to be displaced downward through the position previously occupied by the channel portion 86. The channel portion 86 of the shelf 78 will subsequently be repositioned back underneath the placement head 52 by a reverse actuation of the double acting air cylinder 70. The reverse actuation of the air cylinders 70 will be limited by the position of the abutment shaft 64. In particular, if a large chip has been sensed by the chip sensing station 10 then the extendable member 56 will be retracted by the solenoid actuator 54 so as to cause the rotatable member 58 to move outwardly thus moving the abutment shaft 64 towards the confronting end of the drive shaft 68. This limits the degree of rearward movement of the drive shaft 68 so as to thereby establish a particular position of the slidable shelf 78 relative to the placement head 52. The amount of movement of the abutment shaft 64 is such as to define a centering of the larger chip with respect to the placement head 52 when the larger chip is stopped by the elastomeric stop 90. It is furthermore to be appreciated that if a small chip is sensed by the chip sensing station, then the actuator 54 will cause the extendable member 56 to move outwardly so as to cause the rotatable member 58 to move backwardly into engagement with the adjustable stud 62. This defines a new position for the abutment shaft 64 wherein the end of the drive shaft 68 is allowed to move further rearwardly when repositioning the shelf 78 underneath the placement head 52. It is to be appreciated that the amount of rearward movement of the shaft 68 is limited by the adjustable stud 62. This amount of movement can be set equal to one half the difference in length between the larger size chip and the smaller size chip. This results in the elastomeric stop 90 being positioned so as to center the shorter chip underneath the placement head 52. It is to be noted that receipt of the chip is sensed by a fiber optic sensor 92 which senses the absence of light from a light source 94 when the chip moves into position underneath the chip placement head 52.

Figure 4:
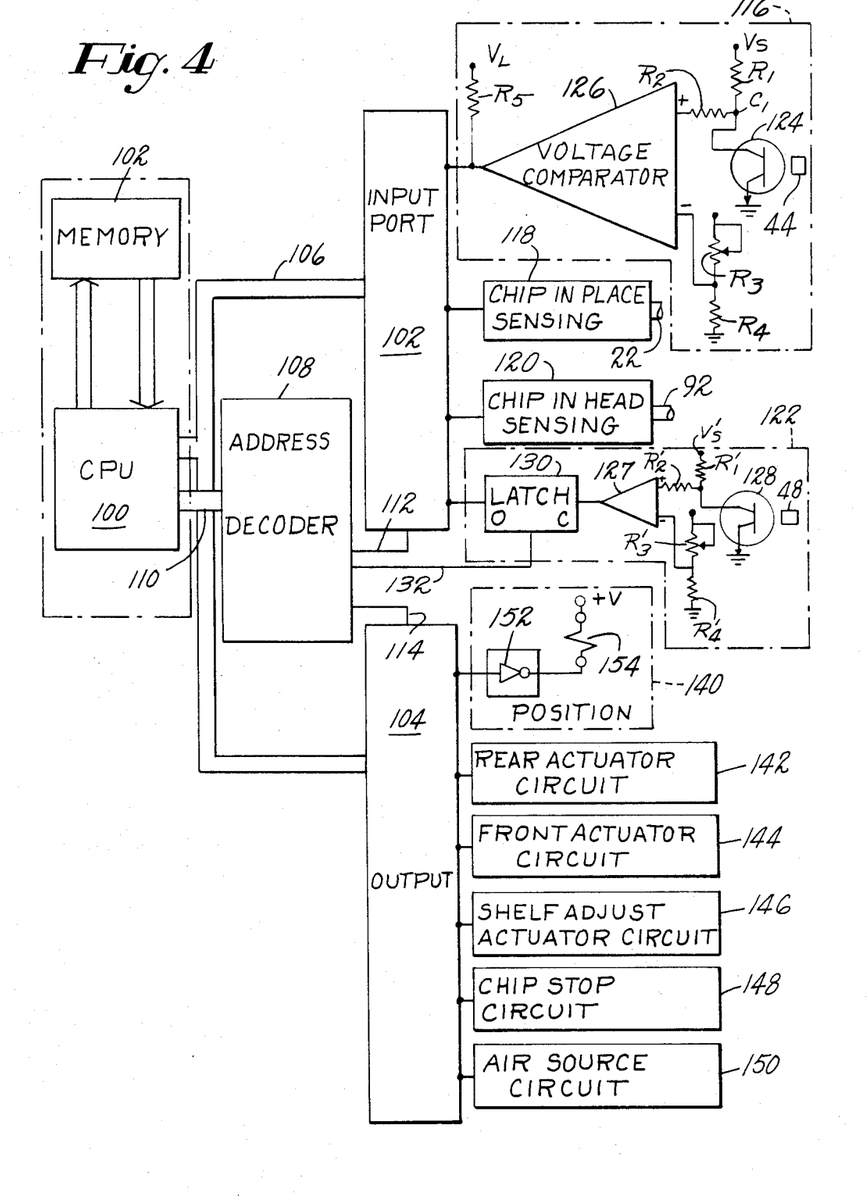
FIG. 4 is a block diagram illustration of the computer control system associated with the stations of FIGS. 1 and 2.

Referring to FIG. 4, a block diagram of the digital control system associated with the chip sensing station 10 and the chip placement station 50 is shown. The digital control system is preferably a microprocessor based system having a central processor unit 100 interfacing with a main memory 102. The central processor unit 100 further interfaces with an input port 102 and an output port 104 via a data bus 106. The data bus 106 is preferably an eight bit bus which either transmits or receives eight bits of information from the input port 102 or the output port 104.

The central processor furthermore interfaces with an address decoder 108 via an address bus 110. The address decoder 108 enables either the input port 102 or the output port 104 via a set of enabling lines 112 and 114. The thus enabled input or output port allows the central processor unit 100 to receive or transmit data over the data bus 106. It is to be understood that the aforementioned relationship with input and output paths is embodied in well known bus structures such as the INTEL Multibus structure.

Referring to the input port 102, it is seen that four separate sensor circuits 116, 118, 120 and 122 are connected to the four input terminals of the port. The port 102 will transmit the binary status of each input terminal to the central processor unit 100 via the data bus 106 when appropriately enabled via the line 112. Each data bit thus appearing on the bus 106 will have a particular meaning relative to the binary status of a respective input terminal. The data bit will preferably be a binary one for a logically high signal level at the respective input terminal. In this manner, the central processor can assess the status of any sensor circuit.

Referring now to the four separate sensor circuits 116, 118, 120 and 122, it is seen that each sensor circuit is associated with a fiber optic sensor at either the chip sensing station 10 or the chip placement station 50.

It will be remembered from the description of the chip sensing station 10 that three fiber optic sensors were required. These included a fiber optic sensor 22 which sensed when a chip was in place within the sensing station, a fiber optic sensor 44 which sensed the length of the chip, and a fiber optic sensor 48 which sensed when the chip had moved out of the sensing station. It will also be remembered that the chip placement station 50 included a fiber optic sensor 92 for sensing when the chip was in place underneath the placement head 52.

The chip length circuit 116 is associated with the chip length sensor 44 and is illustrated in detail in FIG. 4. The circuit 116 comprises a photo transistor 124 which becomes increasingly conductive in response to the amount of light appearing in the "chip length" sensor. The photo transistor 124 is connected between a supply voltage $V_s$ and ground. A resistance $R_1$ defines the voltage upstream of the photo transistor 124. An input resistance $R_2$ lowers the upstream voltage before application to the positive terminal of a voltage comparator 126. The thus applied voltage is compared with a predefined voltage at the negative terminal of the voltage comparator 126. The predefined voltage at the negative terminal is established by a variable resistor $R_3$ and a resistor $R_4$. The predefined voltage at the negative terminal will be less than the voltage appearing at the positive terminal when the photo transistor 124 is in a low or relatively non-conductive state. This will result in the output of the voltage comparator 126 being in a logically high voltage condition. The input voltage at the positive terminal of the voltage comparator 126 will however drop when the photo transistor 124 becomes increasingly conductive. This voltage drop relative to the predefined voltage at the negative terminal will cause the output of the voltage comparator 126 to switch logically low. It is to be noted that the output voltage of the voltage comparator 126 is referenced with respect to a logic level voltage source $V_L$ having a resistance $R_5$ associated therewith. This output configuration will define compatible voltage and current conditions for the input of the input port 102. In summary, it is to be understood that the input sensor circuit 116 produces a logically high buffered voltage to a predefined input terminal of the port 102 when the sensor 44 is transmitting relatively low or negligible light. This indicates that a large size chip is covering the sensor 44. The sensor circuit 116 will otherwise produce a logically low buffered voltage to the same input terminal when the sensor 44 is transmitting considerable light. This will be interpreted as a small size chip when a chip has otherwise been noted as being in place within the sensing station 10.

It is to be understood that similar input circuit configurations could be used for the input sensor circuit 118 associated with the "chip in place" sensor 22 as well as the input sensor circuit 120 associated with the "chip in head" sensor 92. The "chip in place" sensor circuit 118 will provide a logically high input signal to the input port 102 when the sensor 22 is transmitting negligible light indicating that a chip has arrived at the sensing station. On the other hand, the "chip in head" circuit 120 will provide a logically high signal when a chip has arrived underneath the placement head 52 so as to thereby interfere with the light otherwise sensed by the sensor 92.

The input sensor circuit 122 associated with the "chip out" sensor 48 is also shown in detail in FIG. 4. This particular sensor circuit preferably includes the same input circuit configuration as is present in the sensor circuit 116. This input configuration includes a photo transistor 128 and a voltage comparator 129 connected in the same manner as has been previously discussed for the input sensor circuit 116. It is to be noted that a latch circuit 130 has been added to the sensor circuit 122. The operation of the sensor circuit 122 begins with the photo transistor 128 normally receiving light directly through the sensor 48 from the light source 49. The light is momentarily blocked by a chip passing over this light source. This will cause a momentary loss of conduction in the photo-transistor 128. This momentary change in conductivity produces a logically high signal at the positive input of the comparator 129. The comparator 129 will momentarily switch logically high and produce a pulse at the input of the latch circuit 130. The latch circuit 130 will switch logically high and maintain this signal level at the input of the input port 102. This signal condition will alert the central processor 100 that a chip has passed underneath the sensor 48. Latch circuit 130 is subsequently reset by the central processor addressing the sensor circuit 122 via the address decoder 108. The address decoder resets the latch circuit 130 logically low via a line 132. This allows the sensor input circuit 122 to subsequently respond to the next chip passing underneath the sensor 48.

Referring now to the output port 104, it is seen that five separate actuator circuits 140, 142, 144, 146, and 148 are appended thereto. Each actuator circuit can be separately controlled by issuing a particular encoded signal to the output port 104 via the bus 106. The output port will appropriately energize the output terminal associated with the particular actuator circuit. Each output terminal will preferably be brought logically high when the actuator circuit associated therewith is to be activated. Referring to the actuator circuit 140, it is seen that a buffer amplifier 152 responding to a logically high level signal will cause current to flow through a solenoid 154. Current flow through the solenoid 154 will normally cause an actuator to extend. In this regard, the actuator circuit 140 is associated with the position actuator 28. It will be remembered that the position actuator 28 extends so as to move the chip 16 against the wall 24. In a similar manner, logically high output level signals activate solenoids within actuator circuits 142, 144, 146, 148 and 150. In this regard, the solenoid within the rear actuator circuit 142 causes the rear actuator 38 to extend thus positioning the chip 16 against the stop 18. The energized solenoid within the front actuator circuit 144 causes the front actuator 38 to extend. The solenoid within the "shelf adjust" actuator circuit 146 causes the actuator 54 to extend. The only opposite action of an actuator is that with respect to the "chip stop release" circuit 148 wherein the solenoid causes the actuator 20 to retract the chip stop 18. Finally, the solenoid within the air valve solenoid circuit 150 causes an air valve so as to produce a jet of air from the air source 14 which moves the chip out of the chip sensing station 10.

Referring now to FIGS. 5A through 5D, a flow chart depicting the operation of the central processor unit 100 according to a stored computer program in main memory 102 is shown. It is to be noted that FIGS. 5B, 5C and 5D each begin with lower case alphabetic references. These references maintain flow chart continuity by relating back to the same references as the previous figure. The stored program begins with a step 200 wherein the output port 104 is initialized by the central processor. This is accomplished by addressing the output port via the address decoder 108 which enables the output port 104 via the line 114. The central processor unit proceeds to write binary zeroes into the output port 104 via the data bus 106. All terminals associated with the actuator circuits 140 through 150 are thereby set to zero. This will effectively deactivate the solenoids within the respective circuits. In particular, the solenoid within the "chip stop" release circuit 148 will be inactive so as to allow the spring bias associated with the actuator 20 to position the chip stop 18 within the channel 12. The processor now proceeds to a step 201 and initializes the "chip out sensing" circuit 122. This is accomplished by issuing a predetermined address to the decoder 108 so as to generate a signal on the line 132 that will reset the latch circuit 132 to a logically low signal state.

Figure 5A:
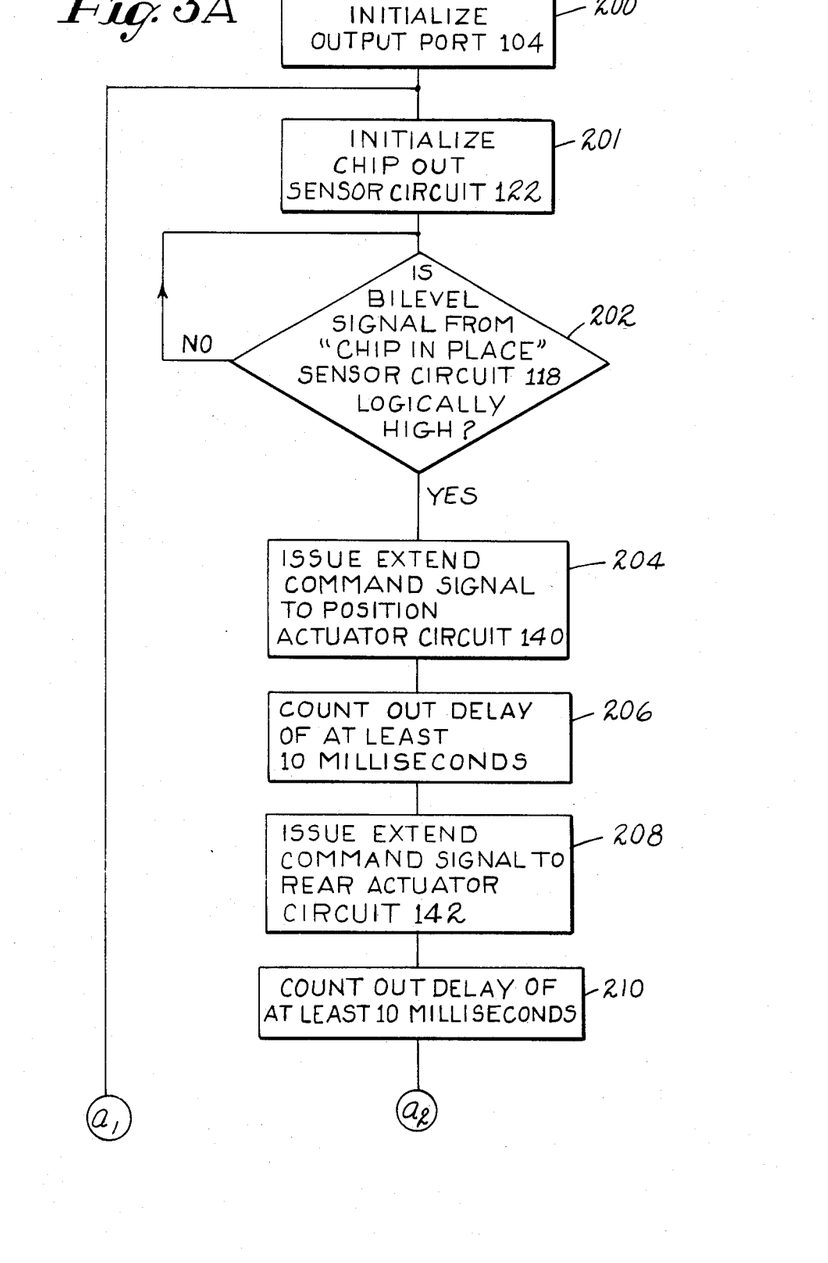
FIGS. 5A-5D are portions of a flow chart illustrating the operation of the central processor unit within the computer control system of FIG. 4.

The central processor proceeds to a step 202 and inquires as to whether the bi-level signal from the "chip in place" sensor circuit 118 is logically high. Referring to FIG. 4, it will be remembered that the sensor circuit 118 is logically high when the photo transistor therein is relatively non-conductive as a result of the blockage of light to the sensor 22. This will produce a logically high signal to the predefined input on the input port 102 associated with the sensor circuit 118. The status of this particular input terminal on the input port 102 can be noted by the central processor unit 100 in the following manner. The central processor unit will define an address for the address decoder 108 which enables the input port 102 via the enabling line 112. The data from the input port 102 appearing on the bus 106 can thereafter be analyzed by the central processor unit 100. In particular, the central processor will be checking one predefined bit of information to ascertain whether or not the bit is a binary one indicating a logically high signal condition at the predefined input terminal associated with the sensor circuit 118. It is to be appreciated that this sequence of events would take place each time the central processor unit 100 is to obtain input information from the input port 102 via the bus 106.

When a "chip in place" has been sensed, the central processor unit will proceed to a step 204. The central processor now issues an extend command signal to the position actuator circuit 140. This is accomplished by addressing the output port 104 via the address decoder 108 so as to provide an enabling signal to the output port 104 via the line 114. The output port 104 will hence receive a byte of information wherein one predefined bit is a binary one. This particular bit of information will cause the designated terminal of the output port 104 associated with the position actuator circuit 140 to assume a logically high signal level. This will be inverted through the buffer amplifier 152 so as to cause current to flow through the solenoid 154. The thus activated solenoid 154 will cause the position actuator 28 to extend and thereby move the chip 16 against the wall 24 of the chip sensing station 10. It is to be appreciated that each time a particular movement is to be achieved, the output port will have to be addressed in the aforementioned manner.

The central processor unit 100 now proceeds to a step 206 wherein a delay of at least ten milliseconds is counted out. This allows sufficient time for the mechanical displacement to take place prior to any further contacting of the chip 16. The central processor unit now proceeds to a step 208 and issues an extend command signal to the rear actuator circuit 142. The central processor proceeds to a step 210 wherein a delay of ten milliseconds is again counted out prior to issuing an extend command signal to the front probe actuator circuit 144 in a step 212. This is again preferably a logically high signal so as to activate the solenoid within the actuator circuit 144 which causes the probe member 40 of the front actuator 38 to extend. As has been previously discussed, the extendable members 36 and 40 of the actuators 34 and 38 may be test probes which electrically contact the chip 16 in order to allow the chip to be tested. The central processor unit 100 would exit to an appropriate test as is indicated by the dotted outline step 214 in FIG. 5B. In the event that the contacted chip successfully passes the test, the central processor would proceed to a step 216. It is to be appreciated that the central processor may also proceed directly to step 216 in the event that the chip is not to be tested. Referring to step 216, the central processor unit inquires as to whether the bilevel signal from the "chip length" sensor circuit 116 is logically low. It will be remembered that the chip length circuit is logically low when the sensor 44 is uncovered. This produces a relatively conductive status of the photo transistor 124 within the circuit 116 so as to thereby produce a logically low signal level to the input terminal of the input port 102 associated with the circuit 116. The input port 102 can hence be addressed and the binary status of the particular input terminal associated with the chip length sensing circuit 116 can be noted. In the event that the input terminal is a binary zero indicating a logically low signal condition, the central processor will proceed along a "YES" path to a step 218. The central processor proceeds to issue an extend command signal to the shelf adjust circuit 146. This is implemented by causing the output terminal of the output port 104 associated with the shelf adjust actuating circuit 146 to switch logically high so as to thereby activate the solenoid within the shelf adjust actuator circuit 146. Referring to FIG. 2, the extendable member 56 of the actuator 54 will move outwardly so as to thereby rotate the member 58 clockwise. This will allow the spring biased abutment shaft 64 to move rearwardly. This in turn allows the drive shaft 68 to assume a rearward position. The movable shelf 78 connected to the drive shaft 68 will also move rearwardly so as to cause the elastomeric stop 90 to move towards the placement head 52. This will define a center position for the small size chip relative to the placement head 52.

Referring again to FIG. 5B, it is to be noted that the central processor unit will proceed to a step 219 in the event that the bilevel signal from the chip length sensor 144 is logically high in step 216. This means that the sensor 44 is substantially covered by the larger size chip 16. This will mean that the actuator 54 must be in a rectracted position for the thus sensed chip. This is accomplished by issuing a logically low signal to the actuator circuit 146 deactivating the solenoid therein. It is to be noted here that this may already be the state of the solenoid. In the event that it isn't, deactivating the solenoid will retract the member 56. This will cause the rotatable member 58 to rotate counterclockwise thereby moving the abutment shaft 64 to the right. This will move the shelf 78 further away from the placement head 52. This causes the elastomeric stop 90 to establish a position for centering the larger size chip under placement head 52.

Figure 5B:
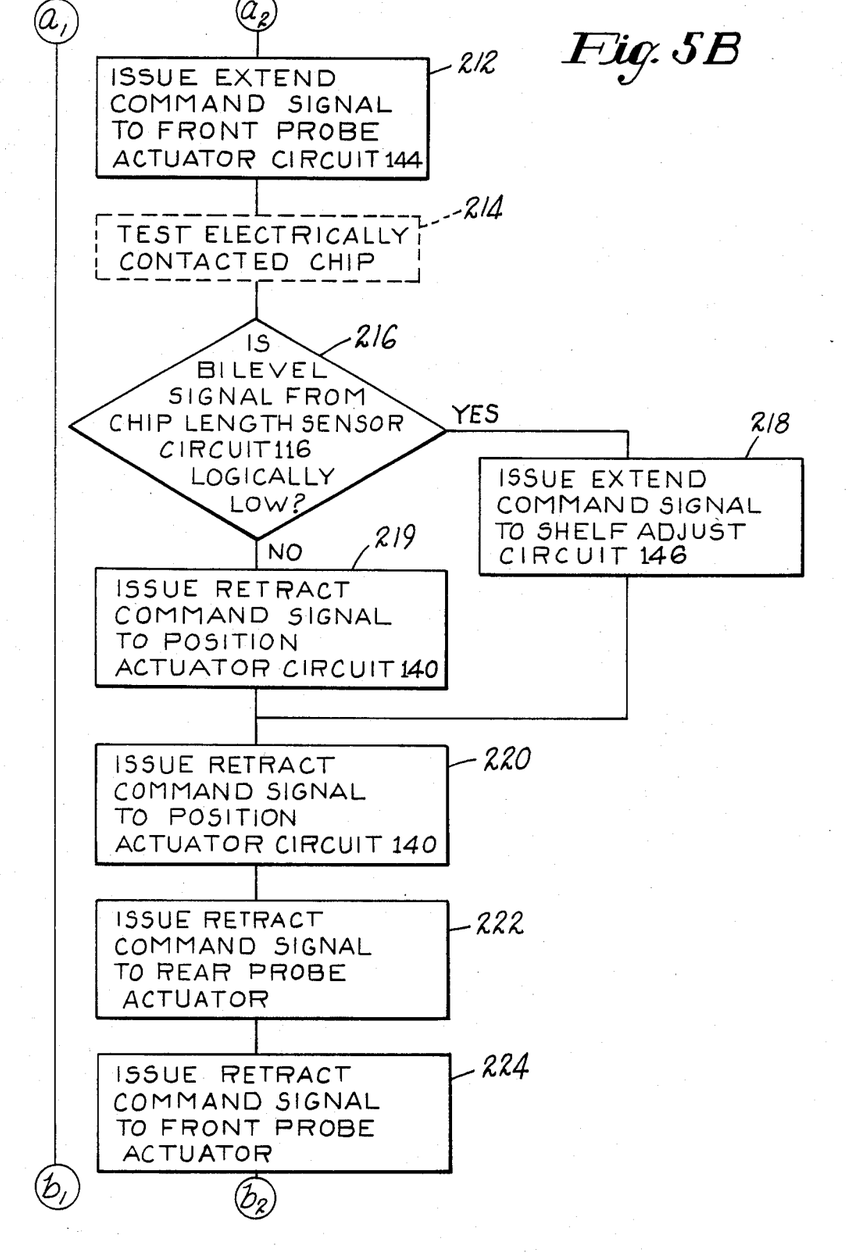

Following the positioning of the shelf 78 by either steps 218 or 219, the central processor will proceed to a step 220 wherein a retract command signal is issued to the position actuator circuit 140. It is to be appreciated that the retract signal will be a logically low signal causing the voltage to rise at the output of the amplifier 152 thereby deenergizing the solenoid 154. This will allow an internal spring biasing within the actuator 28 to retract the bracket 32 from the chip 16. The central processor will proceed to also issue retract command signals to both the rear actuator circuit 142 as well as the front actuator circuit 144 in steps 222 and 224.

Figure 5C:
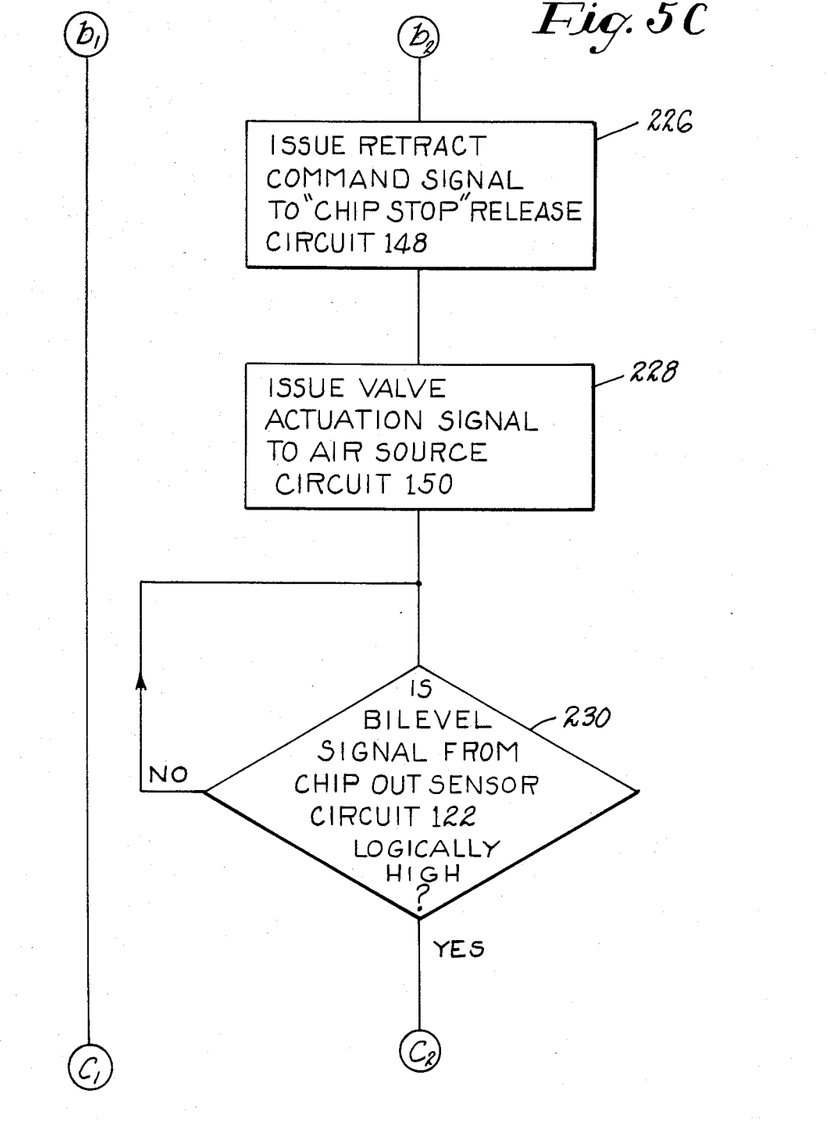
Figure 5D:
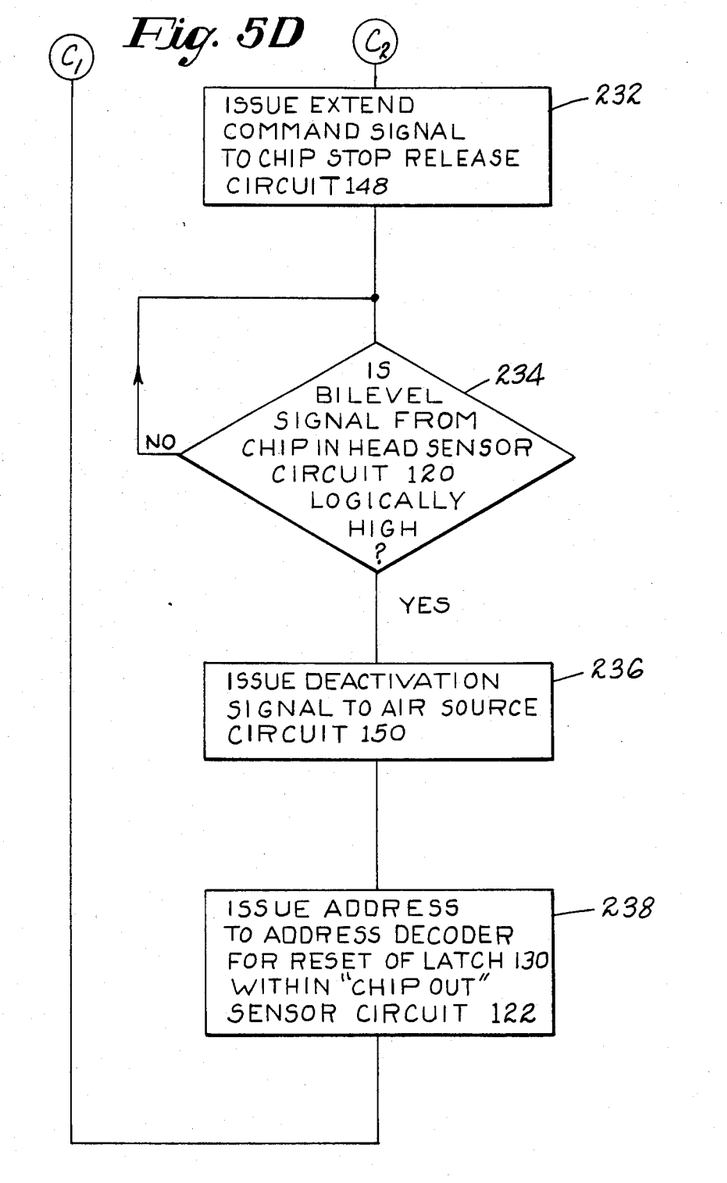

The central processor now proceeds to a step 226 wherein a retract command signal is issued to the "chip stop" release circuit 148. The retract command signal is preferably a logically high signal at the terminal associated with the chip stop release circuit 148. This will allow the solenoid within the chip stop release circuit 148 to move the chip stop 18 against the normal spring bias associated with the chip stop. This retracts the chip stop 18 from the channel 12.

The central processor now proceeds to a step 228 and issues a valve actuation signal to the air source circuit 150. This signal is preferably a logically high signal at the output terminal of the output port 104 which causes the solenoid within the air source circuit 150. This opens a valve which allows pressurized air to flow from the air source 14 into the channel 12. As has been previously discussed, this allows the chip to move down the channel 12 from the chip sensing station 10 to the chip placement station 50. The central processor now proceeds to a step 230 and inquires as to whether the bilevel signal from the "chip out" sensor circuit 122 is logically high. Referring to FIG. 4, it will be remembered that the "chip out" sensor circuit is logically high when the latch circuit 130 has experienced a momentary pulse indicating that the chip 16 has passed underneath the sensor 48. The central processor now proceeds to a step 232 and issues an extend command signal to the "chip stop" release circuit 148. It will be remembered that this is preferably a logically low signal deactivating the solenoid within the chip stop release circuit 148 so as to allow the chip stop 18 to be spring biased upwardly into position within the channel 12. The central processor now proceeds to a step 234 and inquires as to whether the bilevel signal from the "chip in head" sensor circuit 120 is logically high. This will occur when the chip has reached the position underneath the placement head 52 so as to at least partially block the light to the sensor 92. This causes the photo transistor within the circuit 120 to become relatively non-conductive so as to produce a logically high signal at the input terminal of the input port 102 associated with the circuit 120. When this occurs, the central processor proceeds to a step 236 and issues a deactivation signal to the air source circuit 150. This is preferably a logically low level signal which deactivates the solenoid within the air source circuit 150 so as to thereby close a valve within the air source 14 thus depressurizing the channel 12 at the chip sensing station 10. The central processor now proceeds to a step 238 and issues an address to an address decoder 108 which resets the latch 130 via the line 132. This causes the output of the "chip out" sensing circuit 128 to assume a logically low signal level at the designated input of the input port 102.

The central processor now proceeds back to step 201 in FIG. 5A. Referring to FIG. 5A, it is seen that the central processor initializes the "chip out" sensor circuit 122 in step 201. It then proceeds to step 202 and again inquires as to whether a "chip in place" condition has occurred. When this takes place, the central processor proceeds through steps 204 through 238. This will allow for the chip to be positioned within the sensing station 10 and thereafter analyzed for size prior to being moved to the chip placement station 50.

It is to be understood from the above that a preferred embodiment has been disclosed for a chip sensing system within a chip placement machine. It is to be appreciated that various portions of the chip sensing system as well as the computer program associated therewith could be changed without departing from the scope of the invention.

What is claimed is:

1. A system for sensing and responding to the size of an electronic component being processed within a machine which ultimately places the electronic component on a media such as a printed circuit board, said system comprising:

means for temporarily stopping the electronic component at a first sensing station within said machine;

first sensing means for detecting when the electronic component is thus stopped;

means, responsive to said first sensing means, for positioning the electronic component within said first station;

means for sensing the length of the positioned chip within said first station;

means for defining a position of the chip within a second station in said machine in response to the length sensed by said length sensing means; and means for transporting the chip to the predefined position at the second station within said machine.

2. The system of claim 1 wherein said means for defining the position of the transported electronic component within said second station comprises:

means for holding the electronic component underneath a placement head which picks up the component and deposits the electronic component on the media; and means for adjusting the position of said holding means underneath the placement head in response to the length sensed by said length sensing means.

3. The system of claim 2 further comprising:

means for withdrawing said holding means from underneath the placement head prior to said placement head depositing the electronic component on the media.

4. The system of claim 3 wherein said means for adjusting the position of said holding means comprises:

means for defining a stop position of said holding means when said holding means is returned to a position underneath said placement head.

5. The system of claim 1 wherein said means for sensing the length of the positioned chip within said first station comprises:

at least one light sensitive sensor located at a predefined distance from said means for temporarily stopping the component; and at least one light source positioned opposite said at least one light sensitive sensor so as to normally illuminate substantially all of the light sensitive sensor.

6. The system of claim 5 wherein the predefined distance at which said light sensitive sensor is located from said means for temporarily stopping the component is substantially the same as the length of a first sized electronic component to be processed within the machine.

7. The system of claim 6 wherein the length of said light sensitive sensor is substantially the same as the difference between the lengths of the first sized electronic component to be processed and a second sized electronic component to be processed within the machine.

8. The system of claim 5 wherein said at least one light sensitive sensor comprises:

means for responding to the amount of light from said at least one light source so as to define at least one set of signal conditions indicative of the size of an electronic component present at the first station.

9. The system of claim 8 wherein said means for responding to the amount of light from said at least one light source comprises:
   means for conducting an electrical current in response to the amount of light from said at least one light source; and
   means for generating a signal condition in response to the relative conductivity of said means for conducting electrical current.

10. In a machine which processes electronic components of different sizes to a placement head which picks up the components and deposits the components on a media, a system for sensing the size of an electronic component so that the component can be positioned relative to the placement head prior to being picked up by the placement head, said system comprising:
   at least one light source positioned in a processing channel within said machine;
   means for responding to the amount of light from said at least one light source so as to define a set of signal conditions indicative of different component sizes; and
   means, responsive to the set of signal conditions, for establishing at least two distinct positions of components relative to the displacement head wherein each of the at least two component positions centers a component of particular size relative to the placement head.

11. The system of claim 10 wherein said means for responding to the amount of light from said at least one light source so as to define at least one set of signal conditions indicative of the different component sizes comprises:
   means for conducting an electrical current in response to the amount of light from said at least one light source; and
   means for generating a signal condition in response to the relative conductivity of said means for conducting electrical current.

12. The system of claim 10 wherein said means for establishing at least two distinct positions of the component relative to the placement head comprises:
   means for holding the electronic component underneath the placement head prior to the component being picked up by the placement head; and
   means for adjusting the position of said holding means underneath the placement head in response to a particular signal condition from said means for responding to the amount of light from said at least one light source.

13. The system of claim 12 further comprising:
   means for withdrawing said holding means from underneath the placement head prior to said placement head depositing the electronic component on the media.

14. The system of claim 12 wherein said means for responding to the amount of light from said at least one light source so as to define at least one set of signal conditions indicative of the different component sizes comprises:
   means for conducting an electrical current in response to the amount of light from said at least one light source; and
   means for generating the particular signal condition in response to the relative conductivity of said means for conducting electronical current.

* * * * *